United States Patent
Yi et al.

(10) Patent No.: US 10,312,404 B2
(45) Date of Patent: Jun. 4, 2019

(54) SEMICONDUCTOR LIGHT EMITTING DEVICE GROWING ACTIVE LAYER ON TEXTURED SURFACE

(71) Applicant: Lumileds LLC, San Jose, CA (US)

(72) Inventors: Sungsoo Yi, Sunnyvale, CA (US); Nathan F. Gardner, Sunnyvale, CA (US); Michael R. Krames, Los Altos, CA (US); Linda T. Romano, Sunnyvale, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/897,564

(22) Filed: Feb. 15, 2018

(65) Prior Publication Data

US 2018/0175236 A1    Jun. 21, 2018

Related U.S. Application Data

(63) Continuation of application No. 12/830,885, filed on Jul. 6, 2010, now Pat. No. 9,911,896, which is a
(Continued)

(51) Int. Cl.
*H01L 33/00* (2010.01)
*H01L 33/08* (2010.01)
(Continued)

(52) U.S. Cl.
CPC .......... *H01L 33/007* (2013.01); *H01L 33/08* (2013.01); *H01L 33/12* (2013.01); *H01L 33/22* (2013.01)

(58) Field of Classification Search
CPC ....... H01L 33/007; H01L 33/08; H01L 33/22; H01L 33/12
(Continued)

(56) References Cited

U.S. PATENT DOCUMENTS 5,055,894 A    10/1991    Chan
5,684,817 A    11/1997    Houdre
(Continued)

FOREIGN PATENT DOCUMENTS

EP    1641051 A2    3/2006
JP    10326888 A    12/1998
(Continued)

OTHER PUBLICATIONS

EPO as ISA, PCTIB2007/055262, filed Dec. 20, 2007, "International Search Report and Written Opinion", dated Jul. 30, 2008, 13 pages.
(Continued)

*Primary Examiner* — Hrayr A Sayadian
(74) *Attorney, Agent, or Firm* — Volpe and Koenig, P.C.

(57) ABSTRACT

In accordance with embodiments of the invention, at least partial strain relief in a light emitting layer of a III-nitride light emitting device is provided by configuring the surface on which at least one layer of the device grows such that the layer expands laterally and thus at least partially relaxes. This layer is referred to as the strain-relieved layer. In some embodiments, the light emitting layer itself is the strain-relieved layer, meaning that the light emitting layer is grown on a surface that allows the light emitting layer to expand laterally to relieve strain. In some embodiments, a layer grown before the light emitting layer is the strain-relieved layer. In a first group of embodiments, the strain-relieved layer is grown on a textured surface.

5 Claims, 3 Drawing Sheets

Related U.S. Application Data continuation of application No. 11/615,601, filed on Dec. 22, 2006, now abandoned.

(51) Int. Cl.
   *H01L 33/12* (2010.01)
   *H01L 33/22* (2010.01)

(58) Field of Classification Search
   USPC ..... 257/97, 99, 101, 103, E33.005, E33.055, 257/E33.074
   See application file for complete search history.

(56) References Cited

U.S. PATENT DOCUMENTS

| | | |
|---|---|---|
| 5,795,798 A | 8/1998 | Mishra et al. |
| 5,945,689 A | 8/1999 | Koike et al. |
| 6,204,523 B1 | 3/2001 | Carey et al. |
| 6,274,924 B1 | 8/2001 | Carey et al. |
| 6,534,791 B1 | 3/2003 | Hayashi |
| 7,683,386 B2 | 3/2010 | Tanaka et al. |
| 7,880,377 B2 | 2/2011 | Orita et al. |
| 2002/0031153 A1 | 3/2002 | Niwa et al. |
| 2003/0100137 A1 | 5/2003 | Venkatasubramanian |
| 2003/0162340 A1 | 8/2003 | Tezen |
| 2004/0113163 A1 | 6/2004 | Steigerwald et al. |
| 2004/0207310 A1 | 10/2004 | Erchak et al. |
| 2004/0256611 A1 | 12/2004 | Kim et al. |
| 2005/0011431 A1 | 1/2005 | Samuelson et al. |
| 2005/0076828 A1 | 4/2005 | Taki et al. |
| 2005/0082543 A1 | 4/2005 | Alizadeh et al. |
| 2005/0082545 A1 | 4/2005 | Wierer et al. |
| 2005/0194598 A1 | 9/2005 | Kim et al. |
| 2005/0205883 A1 | 9/2005 | Wierer et al. |
| 2005/0225222 A1 | 10/2005 | Mazzochette et al. |
| 2005/0236631 A1 | 10/2005 | Lee |
| 2005/0242364 A1 | 11/2005 | Moustakas et al. |
| 2006/0038190 A1 | 2/2006 | Park et al. |
| 2006/0192195 A1 | 8/2006 | Lee |
| 2006/0223211 A1 | 10/2006 | Mishra et al. |
| 2007/0120141 A1 | 5/2007 | Moustakas et al. |
| 2007/0243703 A1 | 10/2007 | Pinnington et al. |
| 2009/0166649 A1 | 7/2009 | Lee |

FOREIGN PATENT DOCUMENTS

| | | |
|---|---|---|
| KR | 10-2004-0111088 B1 | 5/2006 |
| TW | 560119 B | 11/2003 |
| TW | 200518413 A | 6/2005 |
| TW | 200608606 A | 3/2006 |
| TW | 200637036 A | 10/2006 |
| TW | 200644287 A | 12/2006 |
| TW | 200531270 A | 1/2008 |
| WO | 2006060599 A2 | 6/2006 |
| WO | 2006068377 A1 | 6/2006 |

OTHER PUBLICATIONS

First Office Action, China Patent Application No. 200780047797.9, dated Jul. 30, 2010, 16 pages.
Notification to Grant, China Patent Application No. 200780047797.9, dated Apr. 24, 2012, 3 pages.
Office Action, EP Application No. 07859486.8, dated Nov. 2, 2009, 4 pages.
Office Action, Japan Application No. 2009-542379, dated Sep. 10, 2012, 4 pages.
Office Action, Russia Application No. 2009128240, dated Jul. 21, 2011, 3 pages (Translation Only).
Office Action, Taiwan Application No. 096149061, dated May 20, 2014, 10 pages.
Office Action, Taiwan Application No. 096149061, dated Jul. 25, 2013, 9 pages.
Office Action, Taiwan Application No. 096149061, dated May 27, 2015, 7 pages.
Second Office Action, China patent application No. 200780047797.9, dated Jul. 26, 2011, 10 pages.
English translation of KR 10-2004-0111088.
Mirriam-Webster Online Definition of "adjacent".
"Anti-Surfactant in III-Nitride . . . ," by Tanaka, JJAP, v-39 (200), pp. L8310L834.
Mirriam-Webster Online Definition of "cyran".
Mirriam-Webster Online Definition of "texture".

SEMICONDUCTOR LIGHT EMITTING DEVICE GROWING ACTIVE LAYER ON TEXTURED SURFACE

CROSS-REFERENCE TO RELATED APPLICATIONS

This application is a continuation of U.S. application Ser. No. 12/830,885, filed Jul. 6, 2010, and entitled "SEMICONDUCTOR LIGHT EMITTING DEVICE GROWING ACTIVE LAYER ON TEXTURED SURFACE", which is a continuation of U.S. application Ser. No. 11/615,601, filed Dec. 22, 2006. U.S. application Ser. No. 12/830,885 and U.S. application Ser. No. 11/615,601 are incorporated herein by reference.

BACKGROUND

Field of Invention

The present invention relates to growth techniques and device structures for semiconductor light emitting devices.

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates with both contacts on the same side of the device.

SUMMARY

In accordance with embodiments of the invention, at least partial strain relief in a light emitting layer of a III-nitride light emitting device is provided by configuring the surface on which at least one layer of the device grows such that the layer expands laterally and thus at least partially relaxes. This layer is referred to as the strain-relieved layer. In a conventional device, all the layers in the device are grown thin enough that they are strained, thus the first single crystal layer grown over the growth substrate sets the lattice constant for each strained layer in the device. In embodiments of the invention, the strain-relieved layer at least partially relaxes, such that the lattice constant in the strain-relieved layer is larger than the lattice constant of the layer grown before the strain-relieved layer. The strain-relieved layer thus expands the lattice constant for the layers grown subsequent to the strain-relieved layer.

In some embodiments, the light emitting layer itself is the strain-relieved layer, meaning that the light emitting layer is grown on a surface that allows the light emitting layer to expand laterally to relieve strain. In some embodiments, a layer grown before the light emitting layer is the strain-relieved layer. In a first group of embodiments, the strain-relieved layer is grown on a textured surface.

In a second group of embodiments, the strain-relieved layer is grown within or over posts of III-nitride material, often referred to as nanowires or nanocolumns. In accordance with embodiments of the invention, a III-nitride structure includes a plurality of posts of semiconductor material corresponding to openings in a mask layer. Each post includes a light emitting layer. Each light emitting layer is disposed between an n-type region and a p-type region. A first light emitting layer disposed in a first post is configured to emit light at a different wavelength than a second light emitting layer disposed in a second post. In some embodiments, the wavelength emitted by each light emitting layer is controlled by controlling the diameter of the posts, such that a device that emits white light without phosphor conversion may be formed.

DETAILED DESCRIPTION

Figure 1:
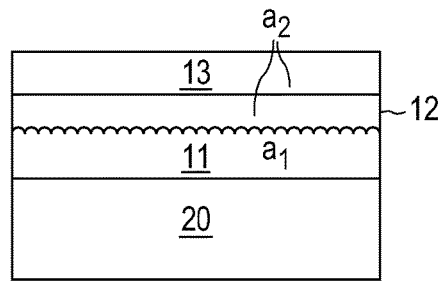
FIG. 1 illustrates a portion of a light emitting device with a strain-relieved light emitting layer grown on a textured layer.

The performance of a semiconductor light emitting device may be gauged by measuring the internal quantum efficiency, which measures the number of photons generated in the device per electron supplied to the device. As the current density applied to a conventional III-nitride light emitting device increases, the internal quantum efficiency of the device initially increases, then decreases. As the current density increases past zero, the internal quantum efficiency increases, reaching a peak at a given current density (for example, at about 10 A/cm$^2$ for some devices). As current density increases beyond the peak, the internal quantum efficiency initially drops quickly, then the decrease slows at higher current density (for example, beyond 200 A/cm² for some devices).

One technique to reduce or reverse the drop in quantum efficiency at high current density is to form thicker light emitting layers. For example, a light emitting layer configured to emit light at 450 nm is preferably thicker than 50 Å. The charge carrier density in a thicker light emitting layer may be less than the charge carrier density in a quantum well, which may reduce the number of carriers lost to nonradiative recombination and thereby increase the external quantum efficiency. However, growth of thick III-nitride light emitting layers is difficult because of the strain in III-nitride device layers.

Since native III-nitride growth substrates are generally expensive, not widely available, and impractical for growth of commercial devices, III-nitride devices are often grown on sapphire or SiC substrates. Such non-native substrates have different lattice constants than the bulk lattice constants of the III-nitride device layers grown on the substrate, resulting in strain in the III-nitride layers grown on the substrate. As used herein, an "in-plane" lattice constant refers to the actual lattice constant of a layer within the device, and a "bulk" lattice constant refers to the lattice constant of relaxed, free-standing material of a given composition. The amount of strain in a layer is the difference between the in-plane lattice constant of the material forming a particular layer and the bulk lattice constant of the layer in the device, divided by the bulk lattice constant of the layer.

When a III-nitride device is conventionally grown on $Al_2O_3$, the first layer grown on the substrate is generally a GaN buffer layer with an in-plane a-lattice constant of about 3.1885 Å. The GaN buffer layer serves as a lattice constant template for the light emitting region in that it sets the lattice constant for all of the device layers grown over the buffer layer, including the InGaN light emitting layer. Since the bulk lattice constant of InGaN is larger than the in-plane lattice constant of the GaN buffer layer template, the light emitting layer is strained when grown over a GaN buffer layer. For example, a light emitting layer configured to emit light of about 450 nm may have a composition $In_{0.16}Ga_{0.84}N$, a composition with a bulk lattice constant of 3.242 Å. As the InN composition in the light emitting layer increases, as in devices emitting light at longer wavelengths, the strain in the light emitting layer also increases.

If the thickness of the strained layer increases beyond a critical value, dislocations or other defects form within the layer to reduce the energy associated with the strain. The defects become nonradiative recombination centers which can considerably reduce the quantum efficiency of the device. As a result, the thickness of the light emitting layer must be kept below this critical thickness. As the InN composition and peak wavelength increase, the strain in the light emitting layer increases, thus the critical thickness of a light emitting layer decreases.

Even if the thickness of the light emitting layer is kept below the critical thickness, InGaN alloys are thermodynamically unstable at certain compositions and temperatures. For example, at temperatures typically used for InGaN growth, the alloy may exhibit spinodal decomposition, where a compositionally uniform InGaN layer transforms into a layer with regions of higher-than-average InN composition and regions of lower-than-average InN composition. Spinodal decomposition in an InGaN light emitting layer creates nonradiative recombination centers which may reduce the quantum efficiency of the device. The problem of spinodal decomposition worsens as the thickness of the light emitting layer increases, as the average InN composition in the light emitting layer increases, and/or as the strain in the light emitting layer increases. For example, in the case of a light emitting layer grown over a [0001] sapphire substrate and configured to emit light at 450 nm, the combination of an InN composition of 16% and the preferred thickness of greater than 50 Å exceeds the spinodal decomposition limit.

Accordingly, as described above, it is desirable to increase the thickness of the light emitting layer to reduce or eliminate the drop in quantum efficiency that occurs as the current density increases. It is necessary to reduce the strain in the light emitting layer in order to grow a thicker light emitting layer, to keep the number of defects within an acceptable range by increasing the critical thickness, and to increase the thickness at which layer can be grown without spinodal decomposition. Embodiments of the invention are designed to reduce strain in the device layers of a III-nitride device, in particular in the light emitting layer.

In accordance with embodiments of the invention, at least partial strain relief in a light emitting layer of a III-nitride light emitting device is provided by configuring the surface on which at least one layer of the device grows such that the layer expands laterally and thus at least partially relaxes. This layer is referred to as the strain-relieved layer. In a conventional device, all the layers in the device are grown thin enough that they are strained, thus the first single crystal layer grown over the growth substrate sets the lattice constant for each strained layer in the device. In embodiments of the invention, the strain-relieved layer at least partially relaxes, such that the lattice constant in the strain-relieved layer is larger than the lattice constant of the layer grown before the strain-relieved layer. The strain-relieved layer thus expands the lattice constant for the layers grown subsequent to the strain-relieved layer.

In some embodiments, the light emitting layer itself is the strain-relieved layer, meaning that the light emitting layer is grown on a surface that allows the light emitting layer to expand laterally to relieve strain. In some embodiments, a layer grown before the light emitting layer is the strain-relieved layer. In a first group of embodiments, the strain-relieved layer is grown on a textured surface. In a second group of embodiments, the strain-relieved layer is grown within or over posts of III-nitride material, often referred to as nanowires or nanocolumns.

In the embodiments described below, the III-nitride light emitting device includes an n-type region typically grown first over a suitable growth substrate. The n-type region may include multiple layers of different compositions and dopant concentration including, for example, preparation layers such as buffer layers or nucleation layers which may be n-type or not intentionally doped, release layers designed to facilitate later release of the growth substrate or thinning of the semiconductor structure after substrate removal, and n-type device layers designed for particular optical or electrical properties desirable for the light emitting region to efficiently emit light.

A light emitting region is grown over the n-type region. Though the embodiments below may refer to a single light emitting layer, it is to be understood that any of the embodiments below may include a light emitting region with one or more thick or thin light emitting layers. Examples of suitable light emitting regions include a single thick or thin light emitting layer and a multiple quantum well light emitting region including multiple thin or thick quantum well light emitting layers separated by barrier layers.

In some embodiments, the thickness of each of the light emitting layers in the device is preferably thicker than 50 Å.

In some embodiments, the light emitting region of the device is a single, thick light emitting layer with a thickness between 50 and 600 Å, more preferably between 100 and 250 Å. The optimal thickness may depend on the number of defects within the light emitting layer. The concentration of defects in the light emitting region is preferably limited to less than $10^9$ cm$^{-2}$, more preferably limited to less than $10^8$ cm$^{-2}$, more preferably limited to less than $10^7$ cm$^{-2}$, and more preferably limited to less than $10^6$ cm$^{-2}$.

In some embodiments, at least one light emitting layer in the device is doped with a dopant such as Si to a dopant concentration between $1\times10^{18}$ cm$^{-3}$ and $1\times10^{20}$ cm$^3$. Si doping may influence the in-plane a lattice constant in the light emitting layer, potentially further reducing the strain in the light emitting layer.

A p-type region is grown over the light emitting region. Like the n-type region, the p-type region may include multiple layers of different composition, thickness, and dopant concentration, including layers that are not intentionally doped, or n-type layers.

FIG. 1 illustrates an embodiment of the invention where a strain-relieved light emitting layer is epitaxially grown over the textured surface of a semiconductor layer. In the device of FIG. 1, an n-type region 11 having an in-plane lattice constant $a_1$ is grown over a growth substrate 20. The top surface of n-type region 11, which may be, for example, GaN, InGaN, AlGaN, or AlInGaN, is textured. A strain-relieved light emitting layer 12 having an in-plane lattice constant $a_2$ is then grown over the textured surface. A p-type region 13, which also has an in-plane lattice constant $a_2$, is grown over light emitting layer 12.

The surface of n-type region 11 is textured with a controlled, rough surface, such as, for example, with features having a cross sectional profile of peaks alternating with valleys. The distance between adjacent peaks may be 50 to 200 nm, more preferably 50 to 100 nm. The depth from the top of a peak to the bottom of a valley may be less than 200 nm, more preferably less than 100 nm. Features of appropriate size, depth, and spacing may be formed by, for example, conventional photolithographic etching, sputter etching, photoelectrochemical etching, or by an in situ process wherein the crystalline material is grown textured, such as by growth at elevated pressure. When the features are appropriately sized, the InGaN material of light emitting layer 12 preferentially grows on the peaks as a group of islands. Since initially the islands do not cover the entire surface of textured n-type region 11, the islands may expand laterally such that light emitting layer 12 at least partially relaxes. The in-plane lattice constant $a_2$ of strain-relieved light emitting layer 12 is larger than the in-plane lattice constant $a_1$ of n-type region 11.

Figure 2:
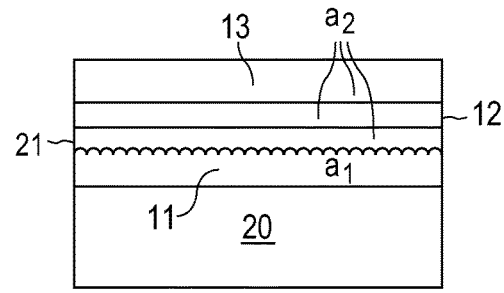
FIG. 2 illustrates a portion of a light emitting device with a light emitting layer grown over a strain-relieved layer grown on a textured layer.

FIG. 2 illustrates a variation of the device of FIG. 1, where the layer grown on the textured surface in order to provide strain relief is not light emitting layer 12, rather it is an n-type layer 21 grown over n-type region 11 before light emitting layer 12. As in the device of FIG. 1, an n-type region 11 having an in-plane lattice constant $a_1$ is grown over a growth substrate 20. The top surface of n-type region 11 is textured as described in reference to FIG. 1. A second n-type region 21, which may be GaN, InGaN, AlGaN, or AlInGaN, is grown over the textured surface of n-type region 11. As n-type region 21 begins to grow, the III-nitride material of n-type region 21 preferentially grows on the peaks of the textured surface of n-type region 11 as a group of islands. The islands of material may expand laterally and at least partially relax, such that the in-plane lattice constant $a_2$ of n-type region 21 is larger than the in-plane lattice constant $a_1$ of n-type region 11. The layers grown over strain-relieved region 21, including light emitting layer 12 and p-type region 13, replicate the larger in-plane lattice constant $a_2$ of strain-relieved region 21.

Figure 3:
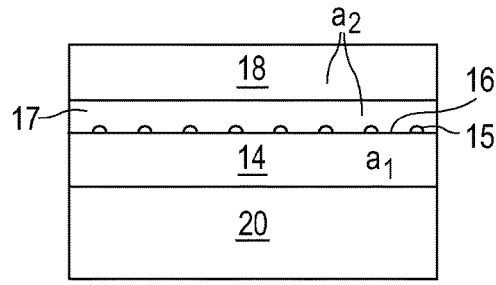
FIG. 3 illustrates a portion of a light emitting device with a light emitting layer grown over a mask.

FIG. 3 illustrates an embodiment of the invention where a strain-relieved layer is grown over a mask. In the device of FIG. 3, an n-type region 14 having a lattice constant $a_1$ is grown over a growth substrate 20. The surface of n-type region 14 is treated with a silicon precursor such as silane such that the surface is partially covered with silicon nitride material SiN$_x$ and partially exposed in small openings in the silicon nitride, creating a mask. The exposed regions may have a lateral extent of 10 to 200 nm, more preferably 50 to 150 nm, and more preferably smaller than 100 nm.

A light emitting region 17 is grown over the mask. The material of light emitting region 17 preferentially grows on the openings 16 in mask material 15, on the exposed the surface of n-type region 14. The islands of light emitting layer material can expand laterally and at least partially relax, such that the in-plane lattice constant $a_2$ of light emitting region 17 is larger than the in-plane lattice constant $a_1$ of n-type region 14. A p-type region 18, also having an in-plane lattice constant $a_2$, is grown over light emitting region 17. As in the devices shown in FIGS. 1 and 2, light emitting region 17 need not be grown directly over the mask, rather a second n-type region of, for example GaN, InGaN, AlGaN, or AlInGaN, may be grown first on the mask, followed by light emitting region 17.

In the embodiments illustrated in FIGS. 1, 2, and 3, where the light emitting layer is grown over a textured interface such as the textured layers in FIGS. 1 and 2 or the mask layer in FIG. 3, the textured interface is generally located close to the light emitting layer. In some embodiments, the textured interface is within 1000 Å of at least a portion of the light emitting layer.

Figure 4:
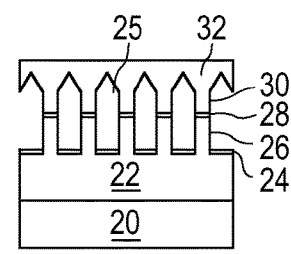
FIG. 4 illustrates a portion of a light emitting device with a light emitting layer grown within a group of posts of semiconductor material.

FIGS. 4, 5, 6, and 7 illustrate devices including posts of semiconductor material. In FIG. 4, an n-type region 22 is grown over a substrate 20. Over planar n-type region 22, a mask layer 24 such as the SiN$_x$ mask described above is formed. In the openings between islands of mask material, posts of semiconductor material are grown. In some embodiments, the growth temperature of the posts of semiconductor material is kept below a temperature at which the GaN material between the islands of masked material begins to decompose, 1000° C. in some applications. The posts of semiconductor material may be grown within a more narrow temperature range than a planar layer grown over a mask, as in FIG. 3, and under conditions that favor slow growth, in order to form posts of semiconductor material rather than the substantially planar layer of FIG. 3. For example, posts may be grown at a growth temperature between 900 and 1000° C., at a growth rate less than 0.5 Å/s, and at a ratio of group V precursors to group III precursors greater than 4000. Planar material may be grown at temperatures greater than 1000° C. and less than 900° C., at faster growth rates, and at different precursor ratios. Posts 26 of n-type material are grown first, followed by posts 28 of light emitting region material, followed by posts 30 of p-type material.

After p-type posts 30 are grown, the growth conditions are changed, for example by introducing or increasing the flow of a dopant precursor such as a Mg-dopant precursor, by decreasing the flow of nitrogen precursor (generally NH$_3$), and by increasing the growth rate, such that inverted pyramids are formed over the posts, which pyramids eventually coalesce to form a planar layer 32 over the posts and spaces 25 between the posts.

The dimensions of the posts of III-nitride material are selected such that the posts may expand laterally to accommodate the difference in lattice constant between layers of different composition within the posts. For example, the diameter of the posts may be limited to less than 500 nm, more preferably less than 200 nm. Diameters as small as 10 nm may be possible. Diameters between 50 and 150 nm, for example in area of 100 nm, are likely. The diameter is selected to be small enough such that the material in the posts can at least partially relax, and large enough that there is an acceptably high fill factor of light emitting layer material. The posts need not have a constant diameter, as illustrated in FIG. 4. For example, the posts may be truncated pyramids. In some embodiments, the fill factor is at least 90%, meaning that as grown, the posts occupy at least 90% of the lateral extent of the semiconductor structure of the device. The fill factor is determined by both the diameter of the posts and the spacing between the posts. If the diameter of the posts is reduced, the number density of posts must increase to maintain a given fill factor. In some embodiments, the number density of posts is at least $10^{10}$ cm$^{-2}$.

The height of the posts may range from 50 nm to 3 µm. In a device with a single light emitting layer, heights between 50 and 150 nm, for example of 100 nm, are likely. In a device with a multiple quantum well light emitting region, heights between 200 nm and 1 µm, for example of 500 nm, are likely. Light emitting region 28 within the posts may be at least partially relaxed.

In some embodiments, in the device illustrated in FIG. 4, the light emitting regions in different posts in a single device may be formed to emit different wavelengths of light. For example, some of the posts in the device may be configured to emit reddish light, some of the posts in the device may be configured to emit greenish light, and some of the posts in the device may be configured to emit bluish light, such that the combined red, green, and blue light appears white.

The emission wavelength of a light emitting regions depends on the InN composition: the more InN in an InGaN light emitting layer, the longer the emission wavelength. In conventional devices with planar, uninterrupted light emitting layers, the strain in the light emitting layer limits the amount of InN that may be incorporated into the light emitting layer. In general, planar InGaN light emitting layers that emit blue light may be grown at higher quality than planar InGaN light emitting layers that emit green light. It is extremely difficult to grow a planar InGaN light emitting layer of high enough quality that emits light at a longer wavelength than green. Since a light emitting region grown within a post as illustrated in FIG. 4 may at least partially relax, more InN may be incorporated during growth than in a conventional strained planar layer. The more relaxed the material in the post, the more InN may be incorporated in the light emitting layer.

The inventors have grown structures with posts including at least one InGaN layer. The structures were characterized by photoluminescence, which showed the emission wavelength from the InGaN material was significantly red-shifted from conventional planar growth. Emission wavelengths between 430 nm and 750 nm, representing colors from blue to red including green and yellow, have been achieved.

In some embodiments, the InN composition in individual posts is controlled by controlling the diameter of the posts. The smaller the diameter of a post, the more relaxed the material in the post, thus the more InN is incorporated during growth of the light emitting region. For example, in a device with posts varying in diameter from about 10 nm to about 150 nm, the posts with diameters in the range of 10 nm are expected to be the most relaxed, have light emitting regions with the highest InN compositions, and emit the longest wavelength, most red light. The posts with diameters in the range of 150 nm are expected to be less relaxed, have light emitting regions with lower InN compositions, and emit shorter wavelength, more blue light.

In order to make a device that emits white light, there must be a controlled number of posts emitting light in each region of the visible spectrum. As described above, the wavelength of light emitted by each post may be controlled by controlling the diameter of the post. To ensure that there are sufficient numbers of each post of a given diameter and corresponding emission wavelength, mask layer 24 may be patterned, for example by a nano-imprinting lithography technique, to form a plurality of openings with the desired diameters. Though a device emitting white light is used as an example, it is to be understood that the emission spectrum from the device can be tailored to other colors of light by patterning mask 24 with openings of the appropriate size.

A device where different posts emit different colors of light such that the combined light appears white may offer benefits over a conventional white-light device, where a blue-emitting semiconductor light emitting device is combined with one or more wavelength converting materials such as phosphors such that the phosphor-converted light combines with unconverted blue light leaking through the phosphor to form white light. A device with posts emitting different colors of light may reduce manufacturing complexity, since it does not require forming wavelength converting layers after forming the device; may offer improved control of chromaticity, color temperature, and color rendering, since the emission spectrum is potentially more easily controlled; may be more efficient, for example by eliminating inefficiencies associated with wavelength converting materials; may be less expensive to manufacture, since expensive wavelength converting materials are no longer required; and may offer greater flexibility in tailoring the emission spectrum.

Figure 5:
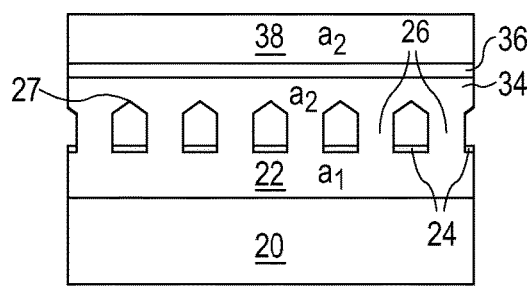
FIG. 5 illustrates a portion of a light emitting device with a light emitting layer grown over a coalesced layer grown over a group of posts of semiconductor material.

In the device of FIG. 5, a strain-reduced light emitting layer is grown over a layer coalesced over a group of semiconductor posts. An n-type region 22 having an in-plane lattice constant $a_1$ is grown over a substrate 20. Over the planar n-type region 22, a mask layer 24 such as the SiN$_x$ mask described above is formed. In the openings between islands of mask material, posts of n-type material 26 are grown. The posts are grown such that the diameter is small enough that the posts may expand laterally and thus at least partially relax, as described above. When growth conditions are altered such that an n-type region 34 coalesces over posts 26, n-type region 34 retains the in-plane lattice constant of the at least partially relaxed posts and thus has an in-plane lattice constant $a_2$ which is larger than the in-plane lattice constant $a_1$ of n-type region 22. A light emitting region 36 and p-type region 38, both of which replicate the in-plane lattice constant $a_2$, are grown over n-type region 34.

Figure 6:
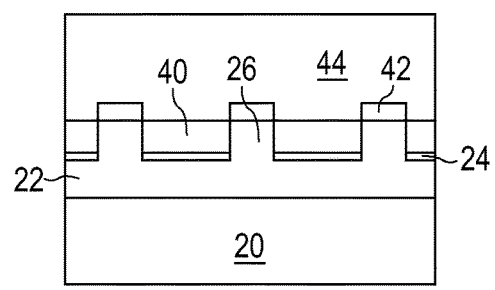
FIGS. 6 and 7 illustrate portions of light emitting devices with light emitting layers grown over groups of posts of semiconductor material and with resistive material electrically isolating regions of n- and p-type material.
Figure 7:
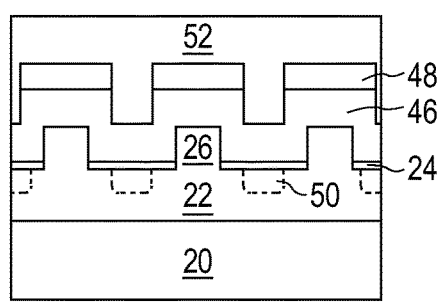

As n-type region 34 coalesces over posts 26, suture defects 27 may form where the material growing over two posts comes together. Defects 27 may be replicated through light emitting region 36 and p-type region 38 and may reduce efficiency or cause reliability problems. FIGS. 6 and 7 illustrate embodiments of the invention designed to eliminate suture defects or reduce the number of suture defects.

In the device of FIG. 6, an n-type region 22 is grown over substrate 20, then a mask 24 is formed and n-type posts 26 are grown as described above, such that posts 26 at least partially relax. A conformal layer of resistive material 40 is formed over posts 26. Resistive layer 40 may be, for example, epitaxially grown resistive GaN such as GaN doped with Zn or Fe, or a resistive oxide such as an oxide of silicon. The resistive layers formed over the tops of posts 26 are then removed by conventional lithography, such that resistive material 40 remains only in the spaces between posts 26. Light emitting regions 42 are then grown as posts over the exposed tops of posts 26, followed by a p-type region 44 which coalesces over light emitting regions 42. Resistive regions 40 electrically isolate n-type regions 22 and 26 from p-type region 44.

In the device of FIG. 7, an n-type region 22 is grown over substrate 20, then a mask 24 is formed and n-type posts 26 are grown as described above, such that posts 26 at least partially relax. A conformal layer of undoped InGaN 46 is grown over posts 26, then growth conditions are switched to conditions favoring post growth in order to grow posts of doped light emitting region 48 over the tops of the regions of conformal layer 46 over posts 26. A p-type region 52 is then grown which coalesces over light emitting regions 48. Doping of the light emitting region islands 48 results in a lower breakdown voltage than the undoped InGaN regions 46 between posts 26, thus n-type regions 22 and 26 are electrically isolated from p-type region 52.

In some embodiments, after growth of light emitting region islands 48, an ion implantation step renders regions 50 between posts 26 nonconductive. After implantation, the ion damaged InGaN regions 46 over the tops of posts 26 may be removed by etching. In such embodiments, light emitting region islands 48 are grown directly over posts 26.

Figure 10:
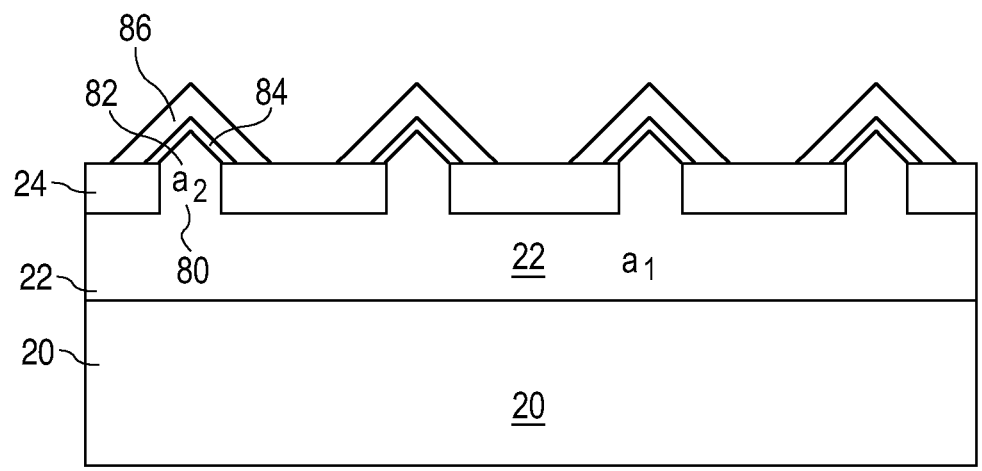
FIGS. 10 and 11 illustrate portions of light emitting devices with conformal light emitting layers grown over polyhedrons grown over openings in a mask.
Figure 11:
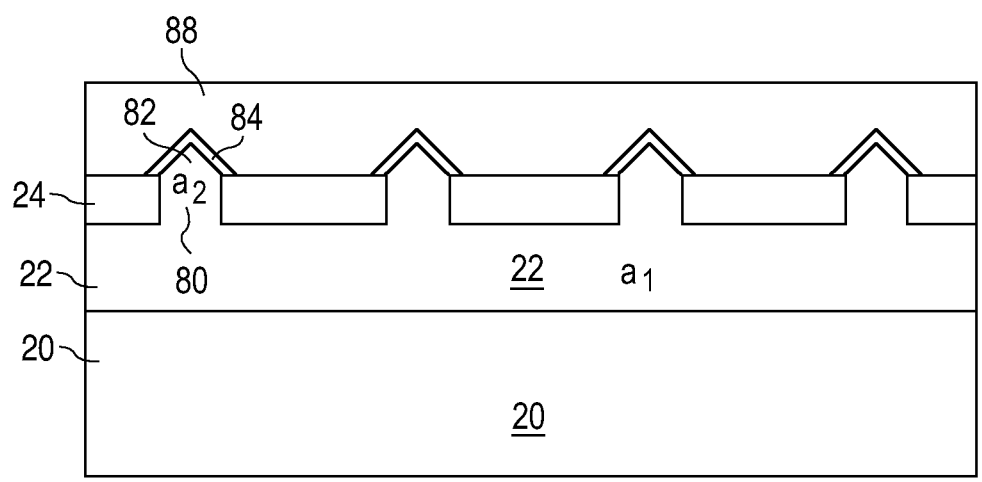

In embodiments illustrated in FIGS. 10 and 11, as in FIG. 4, an n-type region 22 is grown over a substrate 20. Over planar n-type region 22, a mask layer 24 such as the $SiN_x$ mask described above is formed. In the openings 80 between islands of mask material, polyhedrons 82 of semiconductor material are grown. Like the posts shown in FIGS. 4 and 5, since polyhedrons 82 are grown in openings 80 between islands of mask material, polyhedrons 82 are able to expand laterally and are therefore at least partially relaxed. Polyhedrons 82 thus have a lattice constant $a_2$ larger than the lattice constant $a_1$ of planar layer 22. In some embodiments, the diameter of openings 80 may be limited to less than 500 nm, more preferably less than 200 nm. Diameters as small as 10 nm may be possible. Diameters between 50 and 150 nm, for example in area of 100 nm, are likely. The diameter of openings 80 is selected to be small enough such that the material in polyhedrons 82 can at least partially relax. As in FIG. 4, mask 24 may be formed such that the fill factor is at least 90%, meaning that as grown, the bases of polyhedrons 82 occupy at least 90% of the lateral extent of the semiconductor structure of the device.

At least one light emitting layer 84 is grown over polyhedrons 82 such that the material in light emitting layer 84 replicates the expanded lattice constant $a_2$ of polyhedrons 82. A p-type region is then grown over light emitting layer 84. In the device illustrated in FIG. 10, p-type region 86 preferentially grows over polyhedrons 82. Growth is stopped before the region between adjacent polyhedrons, covered by mask 24, is filled in. A thick metal layer (not shown) may be deposited over the polyhedrons to form a planar surface. Insulating mask layer 24 provides electrical isolation between the metal contacting the p-type material and the n-type region of the semiconductor in the regions between openings 80. In the device illustrated in FIG. 11, growth of p-type region 88 continues until the regions between adjacent polyhedrons are filled in, resulting in a substantially planar p-type layer.

The light emitting layers in the embodiments described above may have larger in-plane a-lattice constants than light emitting layers grown on conventional GaN templates, which typically have in-plane a-lattice constants no larger than 3.1885 Å. Growth of the light emitting layer as or over a strain-relieved layer may increase the in-plane lattice constant to greater than 3.189 Å, and may thus sufficiently reduce the strain in the light emitting layer to permit thicker light emitting layers to be grown with acceptable defect densities and with reduced spinodal decomposition. In some embodiments, the in-plane a-lattice constant in the light emitting layer may be increased to at least 3.195 Å, more preferably to at least 3.2 Å. For example, an InGaN layer that emits blue light may have the composition $In_{0.12}Ga_{0.88}N$, a composition with a bulk lattice constant of 3.23 Å. The strain in the light emitting layer is the difference between the in-plane lattice constant in the light emitting layer (about 3.189 Å for light emitting layer grown on a conventional GaN buffer layer) and the bulk lattice constant the light emitting layer, thus strain may be expressed as $(a_{in-plane} - a_{bulk})/a_{bulk}$. In the case of a conventional $In_{0.12}Ga_{0.88}N$ layer, the strain is (3.23 Å-3.189 Å)/3.23 Å, about 1.23%. If a light emitting layer of the same composition is grown according to the embodiments described above, the strain may be reduced or eliminated. In some embodiments of the invention, the strain in the light emitting layer of a device emitting light between 430 and 480 nm may be reduced to less than 1%, and more preferably to less than 0.5%. An InGaN layer that emits cyan light may have the composition $In_{0.16}Ga_{0.84}N$, a composition with strain of about 1.7% when grown on a conventional GaN buffer layer. In some embodiments of the invention, the strain in the light emitting layer of a device emitting light between 480 and 520 nm may be reduced to less than 1.5%, and more preferably to less than 1%. An InGaN layer that emits green light may have the composition $In_{0.2}Ga_{0.8}N$, a composition with a free standing lattice constant of 3.26 Å, resulting in strain of about 2.1% when grown on a conventional GaN buffer layer. In some embodiments of the invention, the strain in the light emitting layer of a device emitting light between 520 and 560 nm may be reduced to less than 2%, and more preferably to less than 1.5%.

The semiconductor structures illustrated and described above may be included in any suitable configuration of a light emitting device, such as a device with contacts formed on opposite sides of the device or a device with both contacts formed on the same side of the device. When both contacts are disposed on the same side, the device may be formed either with transparent contacts and mounted such that light is extracted either through the same side on which the contacts are formed, or with reflective contacts and mounted as a flip chip, where light is extracted from the side opposite the side on which the contacts are formed.

Figure 8:
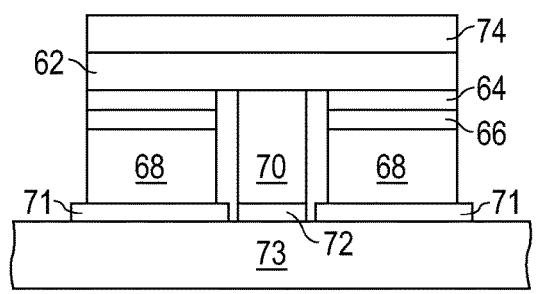
FIG. 8 illustrates a portion of a flip chip light emitting device from which the growth substrate has been removed.

FIG. 8 illustrates a portion of one example of a suitable configuration, a flip chip device from which the growth substrate has been removed. A portion of p-type region 66 and light emitting region 64 is removed to form a mesa that exposes a portion of n-type region 62. Though one via exposing n-type region 62 is shown in FIG. 8, it is to be understood that multiple vias may be formed in a single device. N- and p-contacts 70 and 68 are formed on the exposed parts of n-type region 62 and p-type region 66, for example by evaporating or plating. Contacts 68 and 70 may be electrically isolated from each other by air or a dielectric layer. After contact metals 68 and 70 are formed, a wafer of devices may be diced into individual devices, then each device is flipped relative to the growth direction and mounted on a mount 73, in which case mount 73 may have a lateral extent larger than that of the device. Alternatively, a wafer of devices may be connected to a wafer of mounts, then diced into individual devices. Mount 73 may be, for example, semiconductor such as Si, metal, or ceramic such as AlN, and may have at least one metal pad 71 which electrically connects to p-contacts 68 and at least one metal pad 72 which electrically connects to the n-contacts 70. Interconnects (not shown) such as solder or gold stud bumps, connect the semiconductor device to mount 73.

After mounting, the growth substrate (not shown) is removed by a process suitable to the substrate material, such as etching or laser melting. A rigid underfill may be provided between the device and mount 73 before or after mounting to support the semiconductor layers and prevent cracking during substrate removal. A portion of the semiconductor structure may be removed by thinning after removing the substrate. The exposed surface of n-type region 62 may be roughened, for example by an etching process such as photoelectrochemical etching or by a mechanical process such as grinding. Roughening the surface from which light is extracted may improve light extraction from the device. Alternatively, a photonic crystal structure may be formed in the top surface of n-type region 62 exposed by removing the grown substrate. A structure 74 such as a phosphor layer or secondary optics known in the art such as dichroics or polarizers may be applied to the emitting surface.

Figure 9:
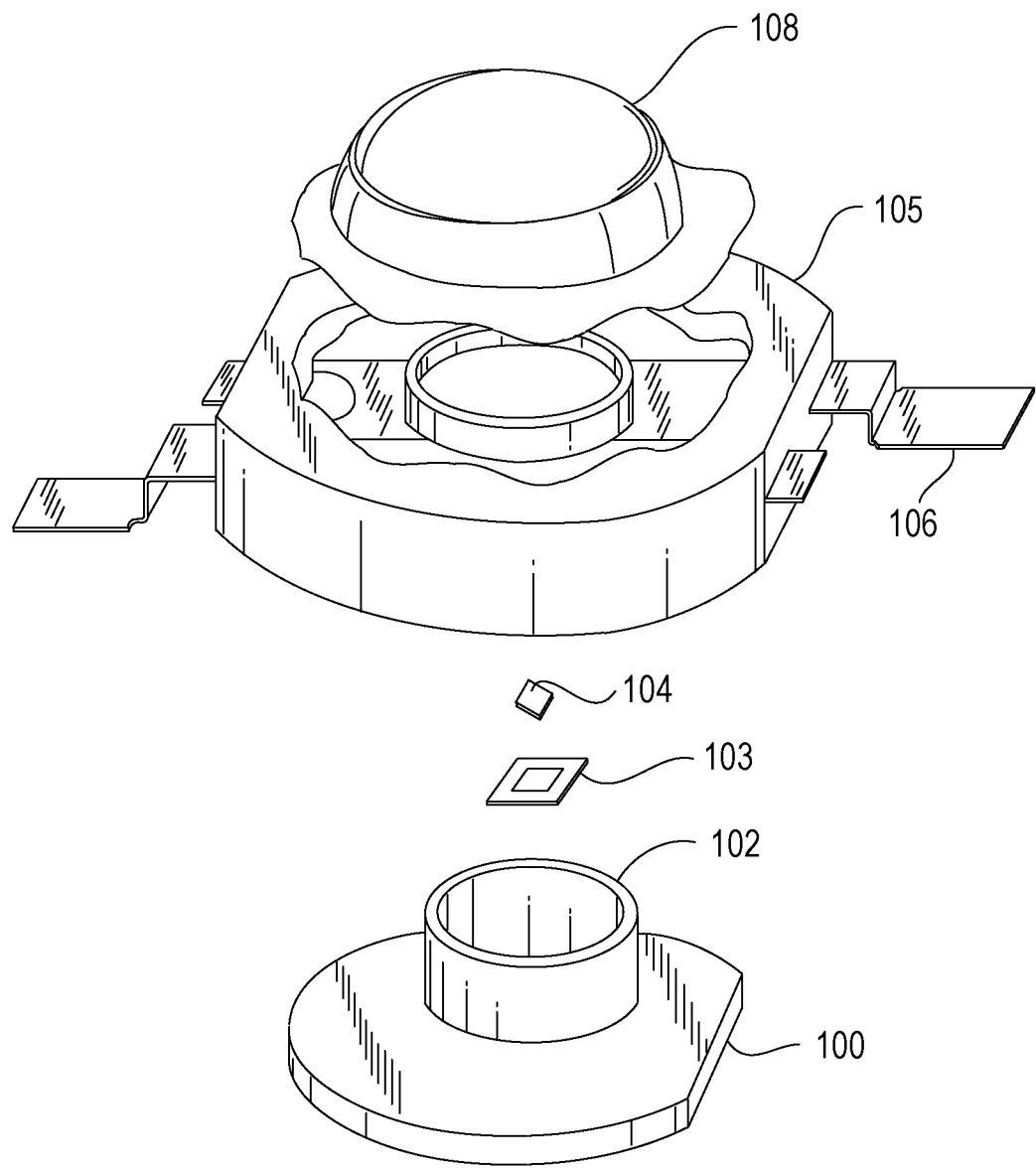
FIG. 9 is an exploded view of a packaged light emitting device.

FIG. 9 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a III-nitride semiconductor structure comprising:
   an n-type layer comprising a textured surface having a cross sectional profile of peaks alternating with valleys;
   a light emitting layer with at least partial strain relief grown over the textured surface, the light emitting layer with at least partial strain relief comprising islands formed on the peaks, the islands expanding laterally to provide the at least partial strain relief.

2. The device of claim 1 wherein the light emitting layer is grown on the textured surface.

3. The device of claim 1 wherein the n-type layer comprising a textured surface is a first n-type layer, the III-nitride semiconductor structure further comprising a second n-type layer with at least partial strain relief grown on the textured surface, wherein the light emitting layer is grown on the second n-type layer.

4. The device of claim 1 wherein the distance between adjacent peaks is between 50 nm and 200 nm.

5. A device comprising:
   a III-nitride semiconductor structure comprising:
   an n-type layer including a textured surface, the textured surface having a cross sectional profile of peaks alternating with valleys;
   an InGaN light emitting layer with at least partial strain relief, the light emitting layer being disposed over the textured surface within 1000 angstroms of the textured surface, the material of the light emitting layer having a bulk lattice constant $a_{bulk}$ corresponding to a lattice constant of a free standing material of the light emitting layer, the light emitting layer emitting light between 430 nm and 520 nm, the light emitting layer having an in-plane lattice constant $a_{in\text{-}plane}$ corresponding to a lattice constant of the light emitting layer as grown in the structure, and $(a_{in\text{-}plane}-a_{bulk})/a_{bulk}$ is less than 1%; and
   a p-type region disposed over the light emitting layer.

* * * * *